(12) United States Patent
Kaszynski et al.

(10) Patent No.: US 7,941,771 B2
(45) Date of Patent: May 10, 2011

(54) METHOD FOR FUNCTIONAL VERIFICATION OF AN INTEGRATED CIRCUIT MODEL FOR CONSTITUTING A VERIFICATION PLATFORM, EQUIPMENT EMULATOR AND VERIFICATION PLATFORM

(75) Inventors: Anne Kaszynski, Ablis (FR); Jacques Abily, Plaisir (FR)

(73) Assignee: Bull S.A., Les Clayes Sous Bois (FR)

( * ) Notice: Subject to any disclaimer, the term of this patent is extended or adjusted under 35 U.S.C. 154(b) by 416 days.

(21) Appl. No.: 12/133,085

(22) Filed: Jun. 4, 2008

(65) Prior Publication Data

US 2008/0270103 A1    Oct. 30, 2008

Related U.S. Application Data

(63) Continuation of application No. 10/627,976, filed on Jul. 28, 2003, now abandoned.

(30) Foreign Application Priority Data

Jul. 30, 2002  (FR) .................................... 02 09691

(51) Int. Cl.
*G06F 17/50* (2006.01)
*G06F 9/45* (2006.01)
*G06F 9/455* (2006.01)

(52) U.S. Cl. ........ 716/104; 716/100; 716/102; 716/103; 716/105; 716/117; 703/14; 703/15; 703/28

(58) Field of Classification Search ............... 716/1, 3, 716/4, 5, 6, 18; 703/14, 15, 28
See application file for complete search history.

(56) References Cited

U.S. PATENT DOCUMENTS

| | | | |
|---|---|---|---|
| 5,732,247 A | | 3/1998 | Plouffe, Jr. et al. |
| 6,175,946 B1* | | 1/2001 | Ly et al. ......................... 716/4 |
| 6,347,388 B1* | | 2/2002 | Hollander .................... 714/739 |

(Continued)

FOREIGN PATENT DOCUMENTS

WO        02 08966 A2    1/2002

OTHER PUBLICATIONS

Krishnaswamy et al.; "A procedure for software synthesis from VHDL models"; Publication Year: 1997; Design Automation Conference 1997. Proceedings of the ASP-DAC '97. Asia and South Pacific; pp. 593-598.*

*Primary Examiner* — Helen Rossoshek

(74) *Attorney, Agent, or Firm* — Miles & Stockbridge P.C.

(57) ABSTRACT

A method for on demand functional verification of a software model of an application specific integrated circuit (ASIC), in a low-level programming language, which separately handles the creation of the model and the debugging of the functional verification tests to be applied to the model in order to create a verification platform. In a transmission mode, an autonomous circuit emulator is created by replacing the model in a low level programming language physically describing the circuit to be validated with a high level description generating response data in accordance with the functional specification of the design as a function of stimuli received. A verification mode includes integration of the software model in low level language of the circuit resulting from the design into a verification platform, and creation of a connection of a previously validated autonomous circuit emulator to the interfaces of the software model.

28 Claims, 4 Drawing Sheets

U.S. PATENT DOCUMENTS

| | | |
|---|---|---|
| 6,389,379 B1 | 5/2002 | Lin et al. |
| 6,477,683 B1 * | 11/2002 | Killian et al. ............... 716/1 |
| 6,513,144 B1 * | 1/2003 | Kim et al. ............... 716/4 |
| 6,760,888 B2 | 7/2004 | Killian et al. |
| 6,993,469 B1 * | 1/2006 | Bortfeld ............... 703/15 |
| 7,036,106 B1 * | 4/2006 | Wang et al. ............... 716/18 |
| 7,168,059 B2 * | 1/2007 | Bowyer et al. ............... 716/18 |
| 7,340,692 B2 * | 3/2008 | Matsui et al. ............... 716/1 |
| 7,340,727 B2 * | 3/2008 | Bailwal ............... 717/136 |
| 2002/0073375 A1 | 6/2002 | Hollander |

* cited by examiner

METHOD FOR FUNCTIONAL VERIFICATION OF AN INTEGRATED CIRCUIT MODEL FOR CONSTITUTING A VERIFICATION PLATFORM, EQUIPMENT EMULATOR AND VERIFICATION PLATFORM

CROSS-REFERENCE TO RELATED APPLICATION

This application is a continuation of application Ser. No. 10/627,976 filed Jul. 28, 2003 now abandoned.

FIELD OF THE INVENTION

The present invention concerns a method for the functional verification of a software model of an integrated circuit for constituting a verification platform, and the verification platform thus created.

The invention is useful during the verification phase of the design of particular specifications of an integrated circuit that meets the needs of an industrial user, usually called an ASIC (Application Specific Integrated Circuit), and also in the checkout phase of the system constituted by the ASIC physical component and the application program executed by the ASIC physical component.

BACKGROUND

In the integrated circuit field, there are two types of circuits, the so-called conventional circuits and the so-called specific circuits, called ASICs. Manufacturers of conventional integrated circuits have standard circuit catalogs wherein the references each designate a particular standardized function. For specific applications, industrial users of integrated circuits prefer to have specific circuits developed, known as ASICs. When the term HDL or HDL-type model is used, it refers to a programming language for describing an integrated circuit that is considered to have a lower level relative to $C^{++}$ language.

The various stages in the development of ASICs are the following:
  definition of a functional specification,
  modeling (defined below) of the ASIC in an HDL-type model description language and functional verification of the design associated with this modeling,
  technological production by the integrated circuit manufacturer, and
  hardware debugging of the circuit.

Functional specification is defined as the generation of documents describing the functionalities covered by the ASIC.

It includes:
  the system level specifications, describing:
    the functional visibility of the registers of the ASIC;
    the coherence protocol that ensures the integrity of the data, in the case of a system with shared memory,
    the specifications of the external interfaces of the components,
  and the specifications describing the choice of implementation of the ASIC.

The HDL-type modeling of the ASIC consists in the description of Boolean logic equations that express its behavior in accordance with its specification. The HDL-type programming language used is a language dedicated to the description of the hardware objects of the integrated circuit (Hardware). It contains the primitives for describing the components with their interface signals as well as storage elements such as registers or memories.

The HDL-type description level serves as an entry point into the automatic generation process, resulting in the provision of masks for the technological processes for manufacturing the circuit.

The purpose of the functional verification of the design of the ASIC is to verify the compliance of the behavior of the HDL-type model of the ASIC with its functional specification before beginning the technological process.

Once the logic of the ASIC is stabilized, a quasi-automatic process applied to the HDL-type description of the ASIC makes it possible to generate a list of the physical cells constituting the ASIC and to generate the masks delivered to the foundry (ASIC manufacturer) for the manufacture of the circuit.

The technological production of the circuit is the chemical process that makes it possible, using masks, to produce physical samples of the circuits.

Non-functional tests are applied after manufacturing to verify that the technological process has gone well and to select samples that are good candidates for mounting in packages for the next validation phase.

Hardware debugging is the first phase in the validation of ASICs in their real system environment after the samples are mounted in packages and connected to cards.

During the manufacturing stage, the ASIC manufacturer is unable to verify that the functional model of the ASIC provided by the industrial user does not include any design errors. It can only confirm the silicon chips compliance with the functional diagram requested.

One of the objects of the invention is to allow the industrial user of the ASIC, prior to the physical production of the circuit, to verify the exactitude of the functional model he is going to provide to the foundry (ASIC manufacturer).

Given the high cost of designing ASICs, it is necessary to validate the theoretical diagram resulting from the functional specification as completely as possible in order to eliminate any remaining errors before beginning the preparation of the production file of the ASIC for the foundry. That is why the description level of the model of the ASIC is used for the functional verification of the design of the ASIC prior to starting the technological production process. The purpose of the verification is to verify the compliance of the behavior of the HDL-type model of the ASIC with its functional specification.

With the increasing complexity of ASICs linked to their high degree of integration and the high cost of manufacturing them, the functional verification makes up a prominent part (more than 60%) of the design phase of the circuit, which will tend to increase even more substantially in the years to come.

Hence the need to have a solid functional verification methodology.

It is within this context that one of the advantages of the proposed invention lies.

When samples of the ASIC physical component have been produced, the industrial user validates the functionality of the system consisting of the ASIC physical component and application program executed by the ASIC and verifies that they comply with the specifications of the system. During this phase, the ASICs, mounted in their packages, are connected, on their card, to their real system environment so as to constitute a validation platform.

The proposed invention can also be applied in this phase.

In order to functionally verify the various parts constituting the model of the ASIC, such as the arithmetic unit, memories, counters, combinational logic, router with cache, and other elements, it is possible to activate them separately, insofar as each of them is directly accessible via the simulated input/ outputs of the ASIC and sufficiently independent of the others. One then verifies that the part in question conforms to a logical functional model defined in the specifications. It is also necessary to verify the interoperation of the various parts, by simultaneously activating several of these parts. In particular, it is necessary to perform combinational tests between the parts, in order to try to verify the absence of any configurations of states of the various respective parts that were not planned during the design of the functional model, and that could result in defective operation, for example a mutual inhibition between two parts. It is easy to understand that the number of combinational tests increases much faster than the number of circuits or transistors in the ASIC. In addition, the presence of memories in the ASIC that can control some of its circuits results in the fact that the global state of the various outputs, for inputs having the same global state at a given instant, depends on the history of the progression of the previous input states.

The debugging of the programming of functional tests is long and expensive. In practice, this debugging is done using the model of the ASIC. In other words, as soon as the model is designed, it is possible to try to detect the following two types of errors: residual errors in the specifications, and errors or omissions in the programs for the functional validation of the ASIC or in the application programs. This accumulation of tasks, each of which reacts to the others, is obviously difficult to manage, and it entails costs and delays.

The present invention seeks to limit one or more of these disadvantages.

SUMMARY

To this end, the invention concerns a method for the functional verification of a software model of an integrated circuit on demand (ASIC), in a low-level programming language (for example of the HDL type), which separately handles the generation of the model and the debugging of the functional verification tests to be applied to the model of the circuit for constituting a verification platform, comprising the following two steps:

creation of an autonomous circuit emulator, obtained by replacing the model in a low level (HDL-type) programming language physically describing the circuit under design to be validated with a high level (for example C++) abstract description generating response data structures in accordance with the functional specification of the project as a function of the stimuli received, this mode being called the "transmission mode."

integration of the software model in low level (HDL-type) language of the circuit resulting from the design into the verification platform, and creation of the connection of the previously validated autonomous simulation configuration, in parallel, to the interfaces of the software model of the circuit, and of the connection of an environment emulator; and utilization of the platform as a reference for the validation of the response data transmitted by the software model of the circuit, this mode being called the "verification mode."

The functionality validation program can thus be debugged in masked time, in parallel with the generation of the production file for the ASIC. Then, a model of the latter having been generated, one need only have in memory the input sequence of the functionality validation test, since the emulator represents the functional specification and provides the output stimuli in response to this input sequence, as a reference.

Thus, functionally, the emulator constitutes a sort of library that contains all of the possible output states of the model of the ASIC predicted based on the responses of the functional specification to all of the possible stimuli provided by an environment emulator. The provision of input stimuli by the environment emulator is equivalent to addressing the contents of the library in order to select the corresponding predicted output state or stimuli. This library could therefore be a simple memory, constituting a decision table containing all of the predicted output states, addressed in order to decide whether one of its states is the right one. However, the memory size required would generally be excessive, and it is therefore preferable to generate the prediction of the output stimuli in real time, based on the functional specification.

It should be noted that the method of the invention is not limited to purely digital ASICs, since it is possible to emulate analog circuits, if necessary, using a digital computation unit and a digital/analog converter.

In one embodiment, a user generates, using a data processing system, the autonomous simulation configuration corresponding to the software model of the ASIC using the functional specification, the user writes, from the functional specification, and stores in a test platform for integrated circuit models, a program for testing the model of the ASIC, comprising input stimuli sequences to be provided to the software model of the ASIC, which the autonomous simulation configuration, based on the functional specification, corresponds to output stimuli sequences.

the user links together, and activates, the autonomous simulation configuration and the test platform, and he observes the output stimuli of the HDL-type model of the ASIC in order to functionally validate the system constituted by the software model of the ASIC circuit and the validation test program, and thus validates the software module with respect to the functional specification.

Advantageously, the autonomous simulation configuration communicates with the user to control the activation of previously created and stored models of input stimuli sequences defined in a high level programming language, and controls the activation of associated programs for the progressive validation of test sequences determined from the models.

Thanks to the modularity of the system and the progressivity of the debugging, the user can thus rely, at first, on existing functional validation test models, theoretically debugged, which he adds to or adapts to the particular case of the ASIC.

The user can write and provide the functional specification in a low level programming language, specifying functional models of circuits.

He can also, in a mixed mode, provide the functional specification in the form of a program in low level language, of (HDL type) functional models of circuits, and of a program in high level language of (symbolic (C++)) functional models of circuits, and control the autonomous simulation configuration (1) so as to perform a co-simulation by synchronizing the execution of the two specification programs.

The various parts of the functional specification can thus be written in the language that works best and that, in particular, avoids wasting any time in defining output stimuli.

Advantageously, the test platform verifies that the responses of the software model of the ASIC are within response time ranges specified in the functional specification.

The invention also concerns a verification platform for a software model of an integrated circuit on demand, characterized in that it comprises data processing means that allow a client to select test models producing input stimuli for the ASIC, these processing means being designed to read functional specification elements of the ASIC and comprising programs designed to generate a functional validation test program constituted by output stimuli, from the input stimuli and the functional specification elements.

Advantageously, the verification platform comprises a library of functional models of circuit blocks for ASICs and means for selecting models through a definition file of the configuration, in order to create a model corresponding to the functional specification of the ASIC that is integrated into the definition of its environment.

There may also be, in a link connecting it to the client, two serial programming language adaptation circuits, designed to transform commands in a high level language (C++), used by the client, into commands in a low level language (of the HDL type) that can be used by the model of the ASIC, and respectively, to transform the commands in a low level language back into commands in a high level language.

Advantageously, the verification platform includes means for executing its operations at the same time as the simulation, which it can interrupt upon detection of an error, at the very moment the error appears.

According to another characteristic, the functional specification elements are constituted by a truth table or behavior table corresponding to the functions of the various parts or various functional circuit elements of the software model of the ASIC, and the propagation delay ranges to be respected between each input and each output.

According to another characteristic, the verification platform has a cache memory for storing the blocks used by the nodes according to their addresses, and means for managing, for an address used by one or more nodes, a presence vector with one presence indicator per node.

According to another characteristic, the programs are object-oriented and the emulator is structured as a set of classes that makes it possible to manage a collection of execution hypotheses for a transaction in a memory block of the software model, and also to manage transactions that are colliding, i.e., using the same memory block.

According to another characteristic, the algorithms of the programs of the emulator perform the following functions: generating predictions, eliminating predictions, readjusting incorrect predictions, reducing the number of valid hypotheses, and terminating collisions.

According to another characteristic, the verification platform is used as an emulator of a router circuit, a circuit with cache, or a router circuit with cache.

According to another characteristic, the verification platform makes it possible to test a software model of an integrated circuit on demand (ASIC), characterized in that it comprises an ASIC emulator for controlling a comparator provided for receiving values generated by the software model of the ASIC circuit tested, upon reception of stimuli sent by at least one stimuli generating circuit storing the test program, an interface for translating the stimuli from an advanced language into a low level language corresponding to that of the software model, and means for validating the verification in case of the detection of a collision by the comparator.

In one embodiment, the means for selecting the response to stimuli that depend on the composition of the circuits tested are constituted by a model generated using means for selecting functional models from a library, which associates with each of the models the responses to a given stimulus, the model corresponding to the composition of the circuit to be tested.

The platform can include means for storing the responses thus selected in order to create a test model to be applied to the circuit tested upon reception of stimuli.

According to another characteristic, each transaction is constituted, at the level of each interface, by a request packet and one or more associated response packets, wherein the values of the parameters and/or the transmission time constraints of the packets can be forced from the functional test program executed by the emulator of the environment, which appropriately translates all of these parameters during the transmission of the packets to the terminals of the software model of the project.

According to another characteristic, the generation of predictions is performed by the emulator of the circuit without having to obtain additional information on the internal operation of the circuit under design.

BRIEF DESCRIPTION OF THE DRAWINGS

The invention will be better understood with the help of the following description of an embodiment of the invention and an implementation of the method of the invention, in reference to the attached drawing, in which.

DETAILED DESCRIPTION

Figure 1:
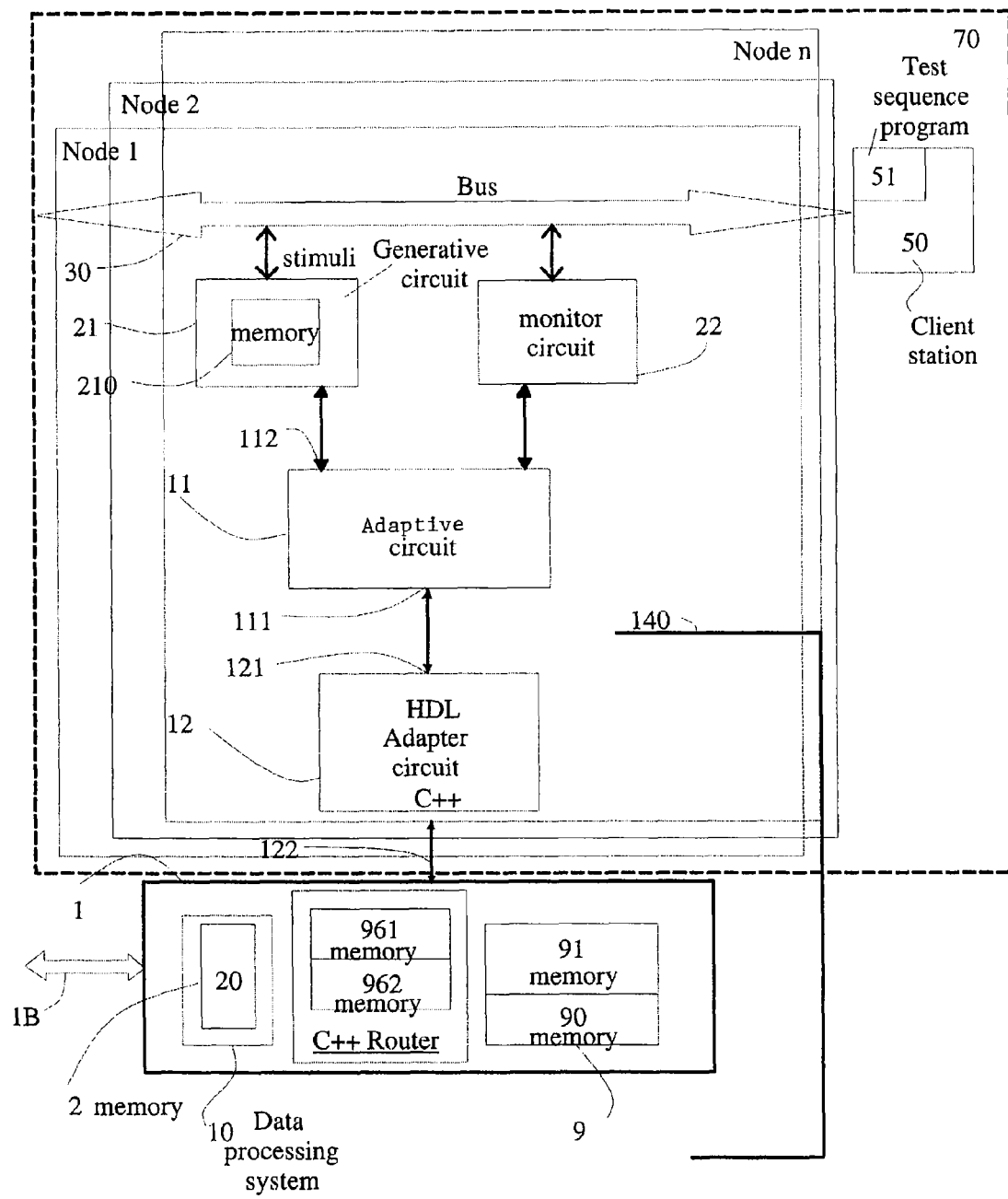
FIG. 1 is a functional diagram representing an emulator of an ASIC integrated circuit, represented with the management of an interface in an environment emulator that can include one or several interfaces.

Before describing the invention, it is necessary, in order to make it clearly understood, to establish a certain number of definitions used below.

An emulator is a program or a device that makes it possible to reproduce in its external interfaces the same functioning as the circuit(s) or HDL-type model(s) of the circuit(s) for which it substitutes.

In this document, the invention is applied to the case of an integrated circuit of the router-with-cache type, because it is recognized as being the most complex case. Hereinafter, the word ROUTER designates:

either the HDL type model of the circuit under design,
or the emulator of the circuit under design ("Design") in transmission mode.

Object programming makes it possible to structure the emulator of the ROUTER as a set of specialized classes, and to simplify the operation by localizing and specializing these operations to each instance of each class, as will be seen below.

In the context of the software simulation ("Software"), the verification platform is constituted by all of the stimuli generating models and the observation models in the interfaces of the circuit under development or design ("Design") to be validated. These observation models constitute an emulator of the environment of the circuit under design ("Design").

The verification methodology of the platform of the invention also makes use of an emulator of the design ("Design"), which can function in two modes:

The Checker mode ("Checker"), in which the emulator of the circuit under design ("Design") serves as a reference for the validation of the responses from the circuit under design ("Design") as a function of the input stimuli applied by the environment emulator, or the responses from the emulator of the circuit under design in the transmitter mode.

The transmission mode, in which the emulator of the circuit under design ("Design") substitutes for the design ("Design") itself in autonomous simulation configurations for the debugging of the verification platform, without having to use the HDL-type model of the design ("Design").

The set of emulators (circuit emulator and environment emulator) constituting the verification platform are object models written in $C^{++}$, connected to the interfaces of the model in a low level HDL-type language of the circuit under design ("Design") via HDL-type interface adaptors. The degree of use of the advanced language relative to the degree of use of the low level HDL-type language varies depending on how far the debugging of the emulators has progressed.

In general, one begins with a functional specification of a circuit containing a majority of $C^{++}$ language and only a few interfaces in an HDL-type language, and ends with a software model comprising a majority of low level HDL-type language and a few interfaces in $C^{++}$. The evolution of the software model in HDL-type language of the circuit under development takes place progressively, using debugged intermediate models containing a more balanced proportion of advanced language relative to the proportion of HDL-type language.

In the interface adapters, the $C^{++}$/HDL exchanges are abstracted into events. The events keep track of the arbitrary exchanges of data contained in the packets as well as the changes in the values of the control signals. The packet is the atomic operation granularity of the abstract $C^{++}$ models belonging to the description level (or so-called protocol) of the interfaces.

In the checker mode ("Checker"), the emulator of the circuit under design ("Design") performs its checks in real time, which means that its operations are executed at the same time as the simulation, which it can interrupt upon detection of an error, at the very moment it appears. This characteristic, which is advantageous from an operational point of view, makes it possible to avoid generating trace files during normal operation and to generate the information required for the diagnosis when there is an error, thus limiting the complexity of the post-processing.

In the checker mode ("Checker"), the emulator of the circuit under design ("Design") can build its checks simply on the basis of the system-level functional specifications, without obtaining any additional information on the internal operation of the circuit under design ("Design"). This remarkable property can be applied in two different types of contexts:

The $C^{++}$/HDL simulation of the circuit under design ("Design"), in which the emulator of the circuit under design ("Design") is connected to all of the interfaces of the software model in low-level HDL-type language of the circuit under design "("Design"), through which it obtains the packet exchanges of the observation models via the interface adapters.

In $C^{++}$ execution alone, from traces obtained through the interfaces of the software model of the circuit under design ("Design"), these traces possibly being reformatted into packet form before being reused offline by the emulator of the circuit under design ("Design").

The traces taken from the terminals of the circuit under design ("Design") to be validated can be from different sources:

In the context of the functional verification, they result from the storage of the packets exchanged during a prior simulation. The traces can exist either in text form or in the form of $C^{++}$ structures known as fibers, stored in a base.

In the context of the hardware debugging, they result from the sampling of the stimuli in the terminals of the physical sample of the circuit. The stimuli abstracted into events are reformatted into packet form prior to being injected into the emulator of the design ("Design") for diagnosis in an offline operation.

The functional tests control the parameterization of the packets transmitted to the target design ("Design") via its environment:

In the context of the functional verification, the functional tests rely on the application program interface (API) of the emulator of the environment of the circuit under design ("Design") to be validated, in order to directly and precisely control the order of the transactions to be transmitted to the design for execution. Each transaction is constituted, at the level of each interface, by a request packet and one or more associated response packets. The values of the parameters as well as the time constraints for transmission of the packets can be forced from the tests. The emulator of the environment appropriately translates all of these parameters during the transmission of the packets to the terminals of the design ("Design").

In this context, the functional tests also have the capability to force, in each component of the system and in conformity with the coherence protocol that ensures the integrity of the data in the system, the initial states of the addresses of the blocks accessed. This capacity makes it possible to create, in a controlled manner, highly diversified and complex coherence situations, without having to reconstruct an execution history that can result in these situations.

In the context of the hardware debugging, the execution of the functional tests is done in a real situation in the processors of the system, which includes the physical samples of the circuit to be validated. The functional tests describe programs translated into a set of instructions to be executed by the processors of the system, which translate them themselves, if necessary, into transactions addressed to the entire system.

In this context, the address spaces are typed. No direct forcing of the format of the transactions or the state of the blocks accessed is possible.

Because of their different natures, it is impossible to rerun, in a real situation on the physical samples in the debugging context, the functional tests previously developed in the context of the functional verification and applied via the environment emulator to the HDL-type model of the circuit under design ("Design") in order to verify its design prior to its physical production.

In FIG. 1, the reference 1 designates an integrated circuit emulator that can be used, in particular, for integrated circuits under design that must be produced on demand, called ASICs. The invention applies to all types of integrated circuits, for example a simple microcomputer type circuit or a complex system, such as for example a multinode coherent memory system. The memory nodes (Node 1-Node n) are interconnected by the integrated circuit under design. A multimode system can be, for example, a set of integrated circuit cards comprising multiprocessors and/or input/outputs with a cache memory forming a plurality of communication nodes containing memories, wherein the nodes can transmit simultaneous requests to addresses in shared memory. The physical ASIC integrated circuit is absent from FIG. 1, and a software model of this circuit under design in a low level HDL-type language has the reference 40 in FIG. 2. The emulator 1 communicates with one or more nodes (Node 1-Node n). Each node can communicate with a client station 50, or all of the nodes can communicate with one and the same client station 50. The emulator 1 is built around a data processing system 10 such as a computer, which receives in memory 2 functional specification data 20 in the high level language, for example $C^{++}$, of the model 40 of the ASIC of the design to be produced in HDL-type language. The data 20 define the responses that the ASIC under design must present to its outputs, upon successive states presented to its inputs. A local access bus or communication means 1B with direct access to the emulator 1 is provided here for managing it.

Generally, as mentioned above, the functional specification data 20 determine that the ASIC under design to be defined by its HDL-type model presents, at a given instant, a given output state that is a function of the current input state that is imposed on it, and a function of the states of its possible "internal" memories (EMI), which usually exist in ASICs. The term internal memory designates memories whose contents, whether or not they are readable from outside the ASIC 40, act on the states of other logic or sequential circuits of the ASIC 40. The states of the memories generally depend on the prior input states of the ASIC, that is, on the history of the input stimuli sequences, and are stored in a memory 962 and in the core 961 of the emulator.

The emulator 1 generally includes, in memory 9, software 90 for operating on the functional specification data 20. The software 90 includes programs for progressively generating and validating test sequences for the functional validation of the ASIC under design. At each step in a functional validation test sequence, the output vector or state, determined as a function of a current input vector and the history, is stored and updated in memory 91. This storage can affect the state of the internal memories (EMI) of the ASIC under design, which in practice is necessary at each step in order to calculate the successive current output vectors, and above all, it can affect the evolution of the states of the internal memories of the ASIC as a function of the successive input vectors, representing the effects of the history.

There is therefore a double "modulation" as opposed to a single input/output bijection.

In essence, on the one hand, different input vectors applied at distinct instants in a stimuli sequence can have effects that "converge," that is. That correspond to the same output vector, due to the effect of the states of the internal memories.

On the other hand, identical input vectors applied at distinct instants in a stimuli sequence can have effects that "diverge," producing different output vectors, due to the effect of the states of the internal memories.

The functional specification defined by the data 20 can specify a truth table or behavior table corresponding to the functions of the various parts or various functional circuit elements of the HDL-type model 40 of the ASIC, but also propagation delay ranges to be respected between each input and each output. The verification platform thus verifies that the responses of the ASIC are within the response time ranges specified in the functional specification 20.

The software 90 for generating functional validation test sequences thus interprets the specification data 20, taking into account the states of the internal memories (EMI) of the emulator, which are the core 961 and the status memories 962 in the cache memory, in order to provide the output vector associated with the input vector. The input vector is provided by a user/operator who is debugging the test program (70).

The reference 30 designates a computer bus or a communication means, connected either directly to a user's terminal or to a data transmission network, which allows a user to dialog in client-server mode with the emulator 1 via a stimuli generating circuit 21, translating the commands transmitted, for example by a communication interface ("socket"), into stimuli, and an interface manager circuit 22, which manages the interfacing between the station 50 of at least one client and the emulator (1). This emulator functions as a user-emulator (50, 1) dialog interface, used in a first step illustrated by FIG. 1. As will be explained below in connection with FIG. 2, the circuit 21 serves to transmit the stimuli generated by the user client in the functional validation phase, in order to apply them as input to the model 40 in HDL-type language of the ASIC and to the emulator 1, and the circuit 22 is a monitor that manages the input and output interfaces between a client station (50) and both the emulator 1 and the circuits 11 for converting from an advanced language to the HDL-type language of the software model 40 of the ASIC. These two circuits (21, 22) constitute, with the adapter 11, the environment emulator. A memory 210 of the test generating circuit 21 is provided for storing input stimuli sequences, the debugging and storage of the input sequences in their final form being, in this example, performed by the program.

The diagram in FIG. 1 thus illustrates an operating mode called "transmission," in which the emulator 1, which receives through the bus 30 commands from the user specifying input stimuli sequences, transmits in return response stimuli representing the response provided for the software model in HDL-type language 40 of the ASIC, thus making it possible to debug the environment emulator 51.

The global test sequence program 51, stored on the client end, will temporarily pass through the memory 210 of a stimuli generating circuit 21.

In this example, as FIG. 1 illustrates, the emulator 1 is connected by the node 122 to the circuits 21, 22 via two circuits 11 and 12 for adapting between the two programming languages, these adaptation circuits being serially connected and having mutually inverse adaptation functions. The adaptation circuit 11, connected directly to the circuits 21 and 22, transforms stimuli (commands) coming from the latter, written in a high-level language, in this case the $C^{++}$ language, into a low-level language, in this case the HDL-type language directly interpretable by the software model 40 in HDL-type language of the ASIC provided, i.e., in this case commands created to be applied, understood and executed by the latter. The stimuli provided by the circuit 21 in $C^{++}$ language are transformed into HDL-type language by an input/output port 111 of the $C^{++}$/HDL adaptation circuit 11. They can be very elementary binary commands, for example logic gates, or more elaborate commands, for example for controlling a processor of the HDL-type model 40 of the ASIC. The latter commands can, in particular, require a macro command, i.e. a sequence of elementary command stimuli.

The inverse HDL/$C^{++}$ adaptation circuit 12, connected to the port 111, serves as a front-end processor for the emulator 1, so that the latter, which uses the $C^{++}$ language, can, after the adaptation of the HDL-type language into the $C^{++}$ language, operate on the stimuli initially translated into the HDL-type language by the circuit 11. This circuit 11 makes it possible to express the stimuli in their real operating form, created to be effectively applied to the software model 40 in HDL-type language of the ASIC of FIG. 2, from the port 111. This also makes it possible to test the proper operation of the C++/HDL adaptation circuit 11 for each of the input stimuli.

The C++/HDL adaptation circuit 11 thus provides, through the input/output port 111, physical and logical level commands or programs that are directly compatible with the software model 40 in HDL-type language of the ASIC provided. These commands are the translation of software commands or programs in a higher level, more abstract, and symbolic language, constituting a descriptor specifying the physical and logical commands actually to be applied. Thus, in this example, the generation of symbolic stimuli sequences of the test program 51, in a language at a higher level than the physical and logical level of the model 40 of the ASIC, makes it possible to remain independent of the physical characteristics and/or the internal programming language of the HDL-type software model 40 of the ASIC, and thus facilitates the writing of these sequences. As indicated, it is the C++/HDL adaptation circuit 11 which, in a subsequent stage of this writing of the sequences, performs the desired transposition for the practical execution of the sequences of the test program 51.

In the opposite direction, from the emulator 1 to the bus 30, the language adaptation circuits 12 and 11 have the inverse functions of those respectively described; the circuit 12 transforms the data received from the emulator 1 formulated in high-level C++ language into data in a low-level, HDL type language. The circuit 11 transforms the same data that were formulated in a low-level language, i.e. of the HDL type, by the circuit 12 back into data in a high-level language, i.e., C++.

As indicated above, the HDL-type software model 40 of the ASIC, absent from FIG. 1, is functionally represented by the system referenced 140, which is constituted by the emulator 1 with, in this case, the adaptation circuit 12 as a front-end processor, an input/output port 121 of which receives the low-level commands from the port 111 and transmits them to the emulator 1 through an input/output port 122, after having transformed them back into a high-level language. In practice, in this case it is the same as that used by the stimuli generating circuit 21, i.e. the C++ language, but the invention also applies in cases where the language used by the circuit 21 would be, of course, advanced, but different from C++. Thus, the user can dialog with the emulator 1 using a high-level language, C++, the language adaptation circuits 11 and 12 having effects that cancel each other out and are thus completely functionally hidden from the user, as long as the circuit 11 does not have any functional defects, as mentioned previously.

Figure 2:
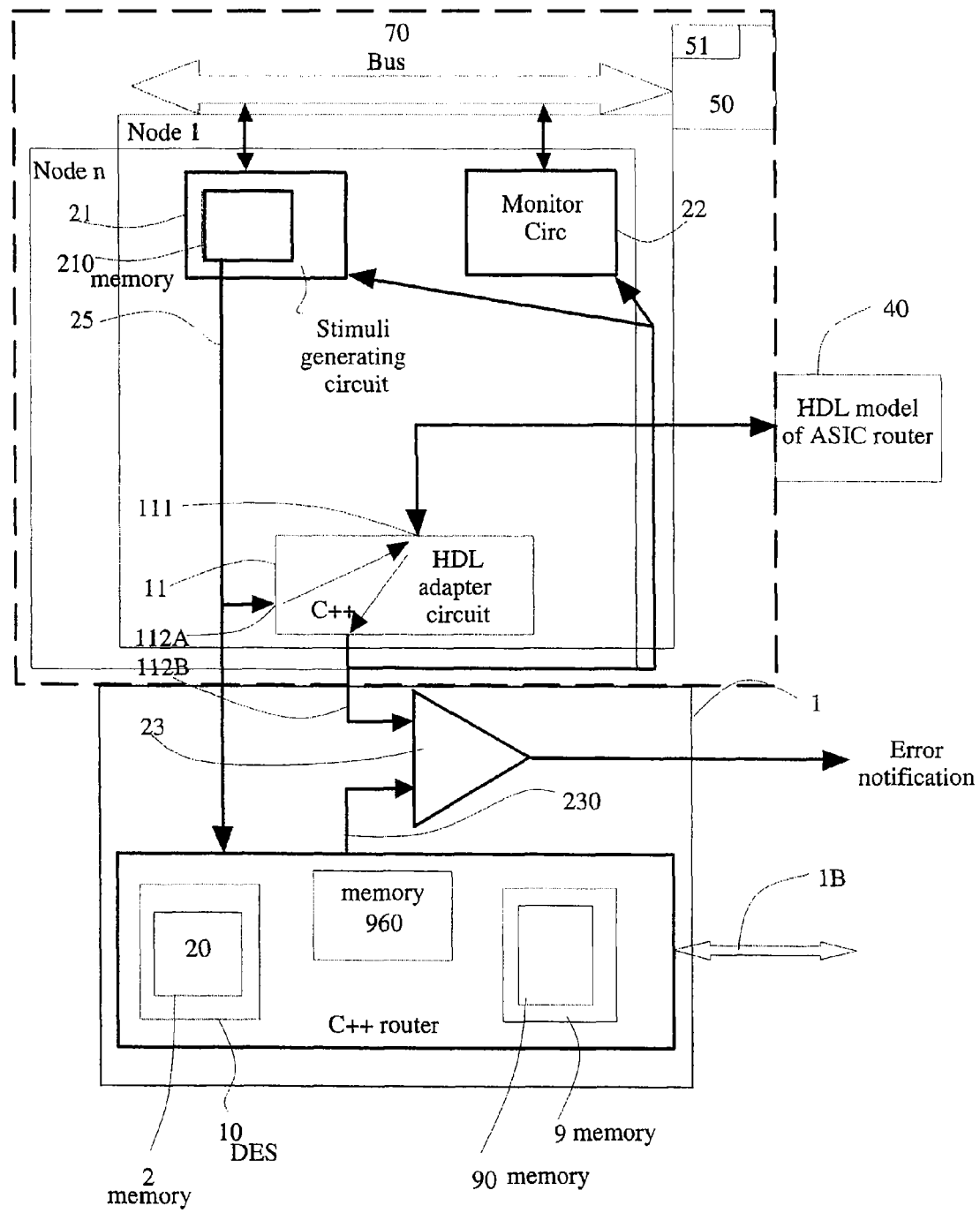
FIG. 2 represents the same emulator, logically connected in parallel to the software model of the ASIC circuit to be tested, or emulator of the circuit under design in the transmission mode, represented with the management of an interface in an environment emulator that can include one or several interfaces.

As indicated above, the system constituted by the emulator 1 and its language adapter 12 constitutes an emulator that conforms perfectly to the software model 40 in HDL-type language of the ASIC, but the debugging of these stimuli sequences is performed using the high-level language, thus remaining independent of the hardware specificities of the ASIC and the specificities of low-level languages for describing integrated circuits, such as the HDL-type language. This debugging also makes it possible to verify, in particular, that the adaptation circuit 11, which is used in the configuration of FIG. 2, provides the desired adaptation for each type of stimuli of the test program 70 debugged. In other words, the debugging of the test program 70 is performed in the high-level language C++, but it includes a verification of the proper functioning of the "scale" (adaptation circuit 12), which makes it possible to "lower" the test program 70 from the symbolic language C++ to the low-level HDL-type language that is directly usable by the HDL-type model 40 of the ASIC.

The functional validation test sequences are debugged by a user connected to the bus 30 by sending the input stimuli and receiving in return reactions from the operating software 90 in memory 9, which indicates any potential defects in the generation of the overall test sequence program, and allows them to be corrected. Once the functional validation test sequences have been debugged, all of the latter constituting the test program 51 are recopied into the operating memory 210 of the stimuli generating circuit 21.

FIG. 2 illustrates a subsequent phase of operation called "verification," in which a functional validation test is performed on the software model 40 of the ASIC in HDL-type language. In this phase, under the control of the stimuli of the test program 51 transmitted by the memory 210, the various input states submitted to the software model of the ASIC are also submitted as input to the emulator 1, which dynamically generates, through the program 90, the predictable outputs that appear successively in the output 230 of the emulator 1, re-using precisely the same functional specification 20 used for the "transmission" mode. The outputs of the emulator 1 evolve in step with the real state of the outputs of the software model 40 of the ASIC in HDL-type language, making it possible to detect any discordance of the desired target operation defined by the emulator 1.

In FIG. 2, the emulator 1 dialogs directly with a stimuli generating circuit 21 and an interface monitor circuit 22 for each mode of the software model, since the C++/HDL language adaptation performed by the adaptation circuit 11 has been verified in accordance with the diagram of FIG. 1. The inverse adaptation circuit 12 is therefore omitted. The software model 40 of the ASIC in HDL-type language is therefore connected to the port 111 of the adaptation circuit 11 (drawn in reverse) serving as a front-end language adaptation processor. In other words, the software model 40 of the ASIC in HDL-type language of FIG. 2 replaces the system 140 constituted, in FIG. 1, by the emulator 1 with its front-end adaptation circuit 12. The emulator 1 of FIG. 2 therefore serves to check the real responses from the software model 40 of the ASIC in HDL-type language by comparing them to those provided by the emulator 1.

The port 112 is represented here divided into an input port 112A, connected to the test stimuli generating circuit 21 by a link 25, and an output port 112B connected to a comparator 23. The HDL-type model of the ASIC 40 thus has, for its environment, an interface 112A, 112B for dialog in the high-level language, in this case C++, used by the other circuits 1, 21, 22 and 23.

The emulator 1 is connected as an input to the link 25, hence directly in parallel to the input port 112A for receiving, like the HDL-type model 40 of the ASIC via the adaptation circuit 11, the stimuli sequences stored in memory 210, which correspond to the validation test program 70 in high-level language, which has been debugged in accordance with the diagram of FIG. 1. In response, the emulator 1 provides the comparator 23 with an output state, stimuli, or vector, as a function of the specification data 20, which is considered to be the target, or reference, output state, associated with the input state. Of the predictable output states, it is the one that is determined or selected based on the input state provided to the verifier 960. The role of the verifier 960 will be explained below.

The software model in HDL language of the ASIC also provides, on its end, an output state that is transformed by the adaptation circuit 11 in order to be presented in the high-level language C++, this output being theoretically identical to the one provided by the emulator 1. The comparator circuit 23 has been drawn so as to illustrate the comparison of the outputs it receives, and in reality, it is functionally part of the emulator 1. The comparator 23 compares the output states of the HDL-type model 40 of the ASIC received through the port 112B, and the output stimuli provided by the verifier 60 of the emulator 1, in order to detect any possible discordance and indicate it to the client user. In such a case, this indicates a lack of compliance of the software model 40 in HDL-type language of the ASIC with the specification 20, due to a design flaw or a functional error at the level of the ASIC-model/test program system. The output from the comparator 23 fills a file that records error notifications in case of an inconclusive comparison. The interface monitor circuit 22 and the stimuli generating circuit 21 receive the outputs from the HDL-type model in order to factor any prior responses into the generation of stimuli and generate trace files for the generator 21.

As mentioned above, the client can, in a variant or complement, write and provide all or part of the functional specification 20 in the form of a program in a low-level language, as defined above, which replaces or complements a comparable high-level program. In the case where the functional specification 20 is thus defined overall in two languages that differ in terms of their levels or another characteristic, the user client controls the emulator 1 so that the test generating software 90 provided for this purpose performs a co-simulation, or co-emulation, by synchronizing the execution of the two specification programs.

Figure 3:
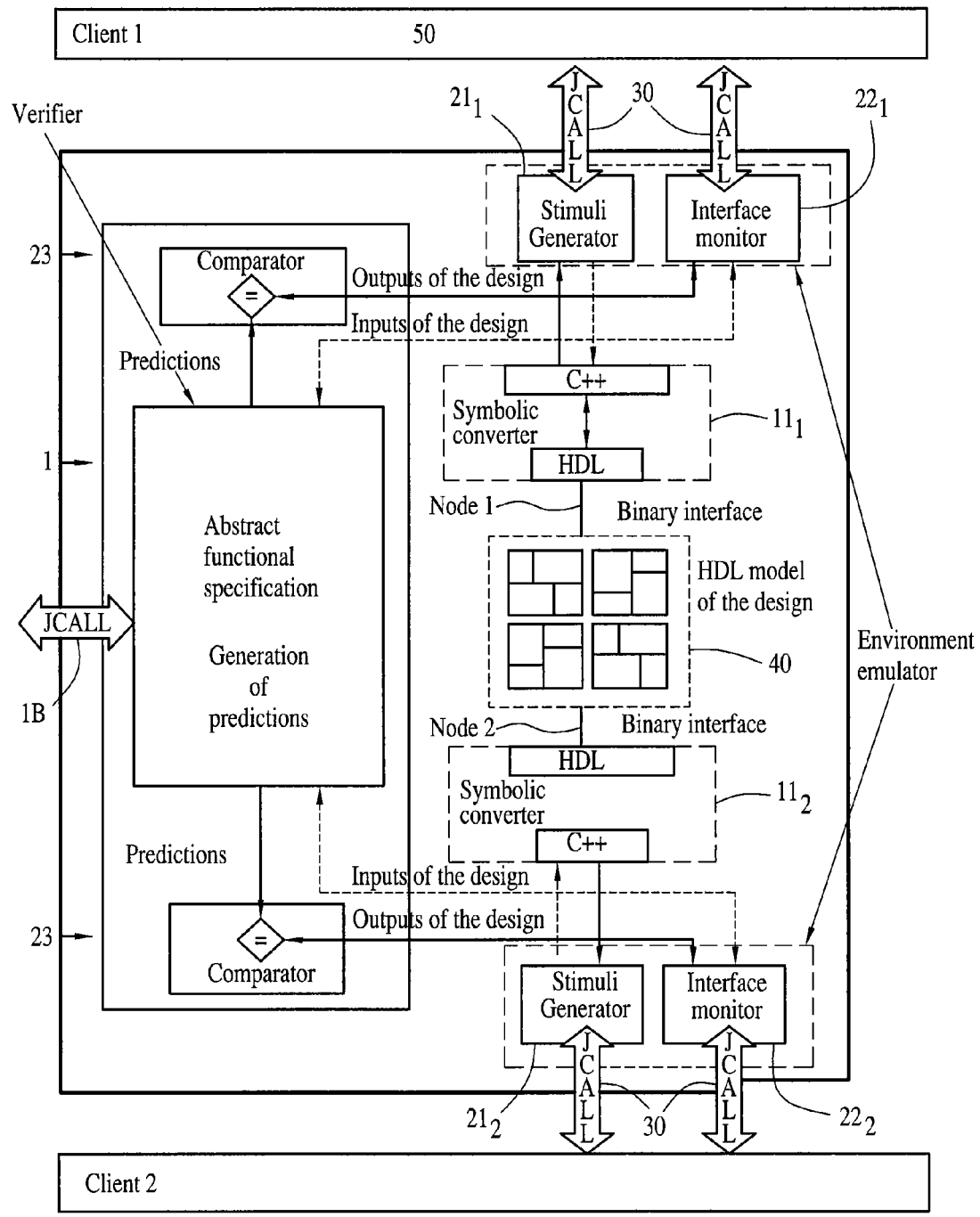
FIG. 3 is a variant of FIG. 2 applied to a model of a circuit with two nodes.

FIG. 3 uses the elements represented in FIG. 2, but with a duplication of the language adaptation circuit $11_1$, $11_2$, respectively, for a first and second node and circuits $21_1$, $21_2$, $22_1$, $22_2$, and of the interface bus 30 for linking with the user clients, for multi-node (Node 1, Node 2) and multi-user (Client 1, Client 2) operation.

FIG. 3 represents an embodiment of the verification platform of the invention which includes the prediction generation model, or emulator 1, constituting the verifier that makes it possible to verify the compliance of the HDL-type model of the ASIC developed with the functional specification and with the tests developed for verifying this functional specification.

In the remainder of the document, the word ROUTER designates either the software model in HDL-type language of the circuit under design, which is a router circuit that allows the routing of information in a multi-node system, or the emulator of this circuit in transmission mode.

A transaction of the system is executed in the following way.

The execution context of the emulator of the ROUTER is a multi-node system with coherent memory, these nodes being interconnected by the ROUTER. A multimode system can be, for example, a set of integrated circuit cards comprising multiprocessors and/or input/outputs forming a plurality of communication nodes containing memories, wherein the nodes can transmit simultaneous requests to addresses in shared memory.

The components of a transaction are the following.

A node can transmit so-called primary requests of the read, write or inhibit type. These requests will receive one or more so-called primary responses. The ROUTER, in order to process a primary request transmitted by a first node P, can be made to generate one or more so-called secondary requests to nodes S that are distinct from the first node P. Each node S will transmit one or more so-called secondary responses. All of these secondary responses will be used by the ROUTER to transmit the primary response.

The combination {request and primary response(s); request(s) and secondary response(s)} constitutes a transaction.

The nodes have a cache memory for storing the memory blocks used, which contain either addresses or data.

The ROUTER has a cache memory (called DIRECTORY in the remainder of the document) for storing the blocks used by the nodes according to their addresses. For an address used by one or more nodes, a presence vector is managed with one presence indicator per node. This cache memory makes it possible to limit the generation of secondary requests to the nodes that can be used for the execution of the transaction (example: an inhibition propagated to the nodes that have the valid presence indicator).

The ROUTER can be made to process several transactions related to the same memory block. This set of transactions is called a collision. The ROUTER handles them serially. The order in which the ROUTER handles them is called the serialization order.

For each primary request, the ROUTER is made to determine the final state of the memory block.

[Case a]: If the determination of this final state by the ROUTER requires one or more {request, secondary response (s)}, the transaction moves into the critical section (until the secondary responses are received), visible to the emulator.

[Case b]: In the opposite case, the emulator only knows of the ROUTER's decision through the primary responses.

The emulator's difficulty in monitoring the activity of the ROUTER results from the fact that the transactions corresponding to the second case [Case b], have a serialization point that is not visible to the emulator.

Conversely, the transactions corresponding to the first case [Case a] have a serialization point that is visible to the emulator, and they offer the emulator an important aid in monitoring the activity of the ROUTER.

The emulator in verification mode will make predictions.

In order to monitor the activity of the ROUTER in case of collision, the emulator must predict all of the possible relevant serialization orders created by this collision.

The generation of predictions consists in the production, for each case of serialization envisaged, profiles of the secondary requests and primary and secondary responses that must appear in the interfaces of the ROUTER.

The observation of an output from the ROUTER {secondary request, primary response} is compared to the prediction profiles. If there is no correspondence, the prediction is rejected.

If there is no prediction that corresponds to the observation, the emulator indicates an error.

Object programming makes it possible to structure the emulator of the ROUTER as a set of specialized classes, and to simplify the operation by localizing and specializing these operations to each instance of each class.

The following classes are used by the invention:

The class "TxnId".

An instance (T) of this class handles ensures the monitoring of the execution of a transaction.

This instance T manages a collection of execution hypotheses (which are instances of the class TxnIdHypothesis).

An execution hypothesis is saved as long as the observations of the outputs from the ROUTER conform to the predictions made by this hypothesis.

The execution of this instance T is considered to be correct as long as there is at least one dynamic hypothesis.

This instance T is in charge of verifying the end of execution of the transaction (that is, if there are dynamic hypothesis that have observed all the predicted outputs of the ROUTER).

The class "TxnIdHypothesis".

An instance (TH) of this class handles the monitoring of an execution hypothesis of a transaction.

This instance (TH) manages an instance of the class Syst_Xaction.

This instance (TH) is in charge of verifying that the observations of the outputs from the ROUTER conform to the predictions of this hypothesis.

The instance (TH) is in charge of handling the responses to the secondary requests.

The class "Syst_Xaction".

An instance (SX) of this class stores the information related to the primary request, and to the secondary request(s) predicted by the attached hypothesis. This instance (SX) also stores execution markers for the transaction.

The class "CollisionScript".

This instance (CS) also handles cases of non-collision (i.e., the case of a current translation in another memory block).

For each transaction involved, an execution hypotheses of this transaction is attached to the instance (CS).

The instance (CS) manages an ordered list of instances of the class "CollisionElement."

This ordering reflects the serialization of the colliding transactions.

The class "CollisionElement".

An instance (CE) of this class manages the execution state of an execution hypothesis of a transaction in a collision context.

The main execution states are:
ASLEEP: no observation of outputs from the ROUTER has been performed for this hypothesis.
PREDICTED: all of the predictions to be used for monitoring the hypothesis have been generated.
WTSNOOP, WTCMP: the transaction is in the critical section, waiting for (a) secondary response(s).
WTTRANS: no observation of outputs from the ROUTER can take place for this hypothesis.
COMPLETED: the transaction is terminated.

For the states ASLEEP and WTTRANS, no prediction has been made.

The state WTTRANS is reached for a hypothesis whose serialization must wait for the end of the critical section of another transaction.

The instance (CE) also manages an instance of the class "DirectoryEntry."

The class "DirectoryEntry".

An instance (DE) of this class manages the state (ESI) of a memory block, as well as the presence vector of this block in the peripheral nodes of the ROUTER.

This information reflects what the ROUTER has for managing the block.

Each subscript of the presence vector (or presence indicator) indicates:
either the certain presence of the block in the attached node;
or the potential presence of the block in the attached node;
In certain cases (for example the execution of certain types of transactions in a collision context), the ROUTER can erase or maintain a presence indicator without indicating this event through specialized outputs that can be observed by the emulator.

The class "Transition".

This class handles the activation of a transition related to an event (EV) {primary request or secondary response in a critical section context} and to an instance DE.

The transition to be activated is searched for in a table (instance of the class TransitionTable).

This activation results in the updating of the instance (DE) and in the activation of an instance of the class "Transition-Action."

The class "TransitionTable."

This class generically describes all of the transitions authorized by the protocol.

For each state of an instance (DE), for each type of event EV, it specifies how to update the instance DE and the instance of the class 'TransitionAction" to be activated.

The class "TransitionAction."

This class encompasses the various types of generic actions to be accomplished following the reception of an event EV.

These actions use as parameters the primary request and the content of the associated instance DE.

These actions include, among other things:
the propagation of an inhibition to the nodes having the presence indicator in the instance DE,
the propagation to the node holding the target memory block of a reading or update of this block;
the propagation of a response to the node that initiated the primary request.

The term "propagation" reflects the generation of the predictions that will be compared to the observations of the outputs from the ROUTER.

The class "Directory."

An instance (D) of this class manages the instances DE associated with the memory blocks present in the filters of the ROUTER.

An instance DE indicates a stable state of the block if no transaction is currently being executed in this block.

In the opposite case, the input DE stores the instances T currently active in this block.

The next state of this instance DE is then currently evaluated in the various instances CE/CS associated with these instances T.

The class "VerifierCore."

An instance (VC) of this class manages all of the activity.

VC receives the stimuli (primary/secondary requests/responses), creates the instances T upon reception of the primary requests, submits the stimuli to these instances and destroys them at the end of the transaction.

The algorithms of the ROUTER perform the following functions:

Prediction generation function:

Upon observation of a secondary request or primary response (transmitted by the router) related to a transaction t, all of the pertinent scripts (i.e., the various orders of serialization) activate this transaction and those that collide are evaluated.

Prediction elimination function:

A prediction is eliminated (i.e. the instance CS of the class CollisionScript is destroyed) if, in this instance CS, the state of the target instance of the class "CollisionElement" is not compatible with the observation, or if, in this instance CS, the prediction handled by the target instance of the class "TxnId-Hypothesis" does not conform to the observation (example: no conformity between the profile of the observation and the prediction).

Incorrect prediction readjustment function:

In certain cases (the execution of certain types of transactions in a collision context), the ROUTER can erase or maintain a presence indicator in its cache memory (Directory) without indicating this event through specialized outputs that can be observed by the emulator. By default, the emulator of the ROUTER generates predictions with the presence indicator erased.

If an observation shows that the opposite choice would be wiser, the instances of the class "CollisionScript" involved are re-evaluated, maintaining the presence bit in question.

Function for reducing the number of valid hypothesis:

In order to monitor a collision, the emulator of the ROUTER is made to generate a number of instances of the class "CollisionScript," which may become high.

Certain collision cases can produce the same observations for the serializations obtained by changing the order in which the transactions involved are handled.

In order to limit the number of instances of the class "CollisionScript," the emulator of the ROUTER detects in each instance "CollisionScript" the subsets of instances of "CollisionElement" in the COMPLETED or PREDICTED state for which the attached instance DE has not changed.

These subsets are re-ordered. The duplicates are eliminated.

Collision termination function:

The emulator of the ROUTER detects, in all of the instances of the class "CollisionScript" related to a collision, the situations in which the n first instances of the class "CollisionElements" are related to the same transactions and result in compatible states of the cache memory (Directory).

These instances of the class "CollisionElements" are then destroyed, and the instance of the corresponding class "DirectoryEntry" in the Directory is updated.

The organization of the emulator thus defined makes it possible to simplify the operation by localizing and specializing these operations to each instance of each class, to isolate a transaction or a collision, and to specialize the classes so as to make the operations generic.

The isolation of a transaction or a collision is obtained through the fact that a transaction is modeled via an entry in the transaction table. This entry consists in a pointer to an instance T of the class TxnId. This instance points to instances TH of the class "TxnIdHypothesis." Each instance TH points to an instance SX of the class "Syst_Xaction," to an instance CS of the class "CollisionScript," and in this instance of the class "CollisionScript, to an instance CE of the class "CollisionElement."

This instance CE points to an instance DE of the class "DirectoryEntry."

The advantages of this organization are air tightness between the processing of the transactions and easy monitoring of a transaction or a collision (objects linked by pointing).

The air tightness between the processing of the transactions ensures a robustness of the processing relative to the load, easy debugging (a problem linked to the processing of a collision is independent of the load and can therefore be analyzed by recreating this collision alone).

The easy monitoring of the operations simplifies the debugging phases and the monitoring of the program.

The specialization of the classes and the genericity of the operations are due to the fact that the classes "Transition," "TransitionTable," and "TransitionAction" are specialized in the processing of the transitions and independently handle a very large part of the protocol. They can be easily adapted to other protocols of the MESI type.

The classes "CollisionScript" and "CollisionElement" are specialized in the processing of the serialization orders. The only pieces of information manipulated are the possible states of the transactions (final state of the predictable block, necessary critical section) and the states of the cache memory (Directory) produced by the transitions. Algorithms for limiting the number of "CollisionScripts" that are independent of the protocol can be applied based on the final states provided by the transitions.

The classes "TxnId," TxnIdHypothesis, and "Syst_Xaction" are specialized in the monitoring of the execution of a transaction (storage of the current secondary requests, various execution indicators, handling of the secondary responses) and in the comparison of the profiles of the predictions and observations.

The classes "Directory" and "DirectoryEntry" are specialized in the management of the cache memory.

All of the cache memory protocols can be easily integrated.

Figure 4:
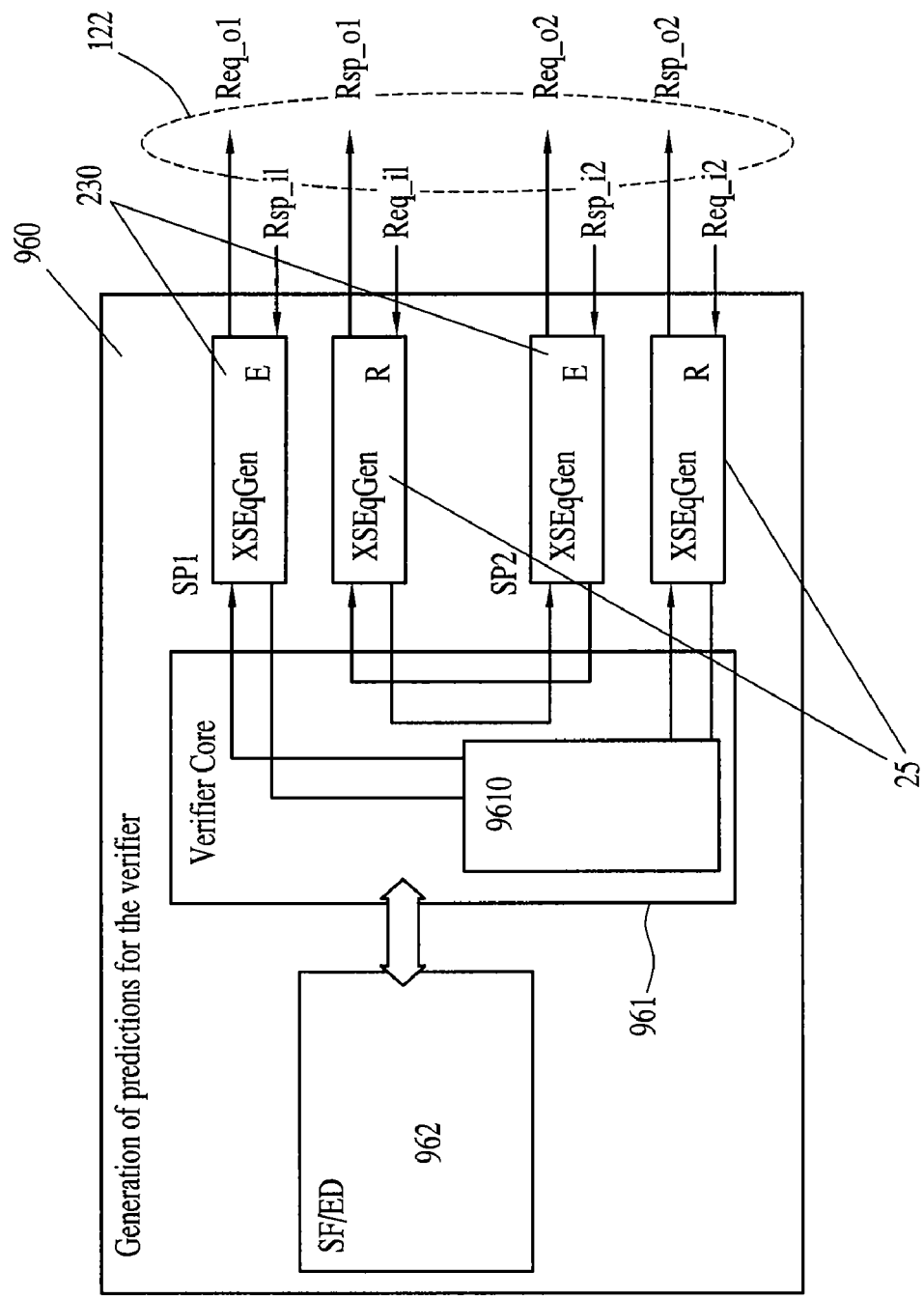
FIG. 4 represents the internal architecture of a verifier.

FIG. 4 represents the internal architecture of the verifier.

Each of the clients transmits, via call commands JCALL, requests for tests of the HDL-type model 40 of the ASIC circuit. These commands are transmitted to the stimuli generator 21 and the interface monitor 22, which sends them to the verifier circuit of the emulator 1 in order to generate predictions of the responses of the model of the ASIC, and to the circuit 11 for converting from an advanced language in $C^{++}$ to a low level HDL-type language for describing the hardware of the ASIC circuit, and through these converters to the HDL-type model of the ASIC circuit.

The requests are received by the processing interfaces XSEqGen (FIG. 4) of the verifier 960 and are also used in the stimuli generating circuits 21, 22 to transmit and verify the request packets. Two instances are used for each interface of the verifier 60; a first, which receives the requests sent to the emulator 1, acts like a responder, while the other, which transmits the requests from the emulator, acts like a transmitter, but both are identical.

The verifier core 961 is the central component that generates the predictions based on the addresses in the directory 962 (SF/ED) of the memory, the presence vector of the response stimuli, and the received packets representing the input stimuli. The verification core 961 is organized around classes instantiated in the form of objects. The verifier core 961 stores configuration registers for routing non-coherent requests, determining the location of the memory for coherent requests, and managing the domains. The core of the verifier includes a table 9610 for the transactions currently being used inside the verifier. Each entry in the table points to an instance of the class TXNID, which represents the transmission of the transaction inside the verifier.

Each time a coherent input request is received by the verifier 961, a temporary structure is created for predicting which transaction in the directory will be used as a block address and which ones will be the predicted outputs from the model of the ASIC circuit under test to the transmission circuit XSEqGen. This temporary structure is an instance of the class "collision element." The processing of a transaction always uses this structure, even if no collision with another transaction is detected.

In order to execute the prediction, the entry in the directory (an instance of the class directory entry) used by this block is copied and used by the instance collision element of the class "CollisionElement." The prediction of the execution is processed through the use of instances of the classes "Transition" and "TransitionAction." The instances of the classes "Transition" and "TransitionAction" are part of the functional specification contained in the memory (2). The instances of this class are created at the time of the simulation and provide methods that are a function of the generation of a state transition and of the generation of requests sent or responses provided by the verifier. These methods are activated by the instances of collision elements of the class "CollisionElement."

The operation of the core is based on the use of a certain number of classes that are used to describe resources and to describe methods used by the instantiations of this class in an object. This structure in the form of classes makes it possible to create a verification platform that is easily modified by instantiating new objects, thus making it possible to describe new test procedures or new responses to stimuli received through new functionalities added to the circuit. It is thus easy to adapt the platform to new circuits developed.

It should be clear to the reader as noted earlier herein that when the term HDL or HDL-type model is used, it refers to a programming language for describing an integrated circuit that is considered to be at the lowest level relative to the so-called high-level C++ language, but this should not be interpreted as a limitation, as the invention also applies to any other programming language for describing an integrated circuit, such as for example VHDL or verilog or any other.

It is understood that the present invention can be implemented in other specific forms, without going beyond its scope of application as claimed. Consequently, the present detailed description should be considered to be a simple illustration of a particular case within the context of the invention, and can therefore be modified without going beyond the scope defined by the attached claims.

The invention claimed is:

1. A method for on-demand functional verification by a computer processing system of a software model of an Application Specific Integrated Circuit (ASIC), comprising deploying the functional verification of the software model using a computer processing system, the computer processing system including a computer readable storage medium upon which is encoded a sequence of instructions, which when executed by the computer processing system, causes the following:
forming, in a first mode, a first autonomous circuit emulator for the ASIC by automatically replacing a plurality of first instructions comprising a software model of the ASIC with a plurality of second instructions comprising the first autonomous circuit emulator;
receiving stimuli at the first autonomous circuit emulator;
generating, by the first autonomous circuit emulator, test response data based on the received stimuli;
outputting, in a second mode for verification, the test response data generated by the first autonomous circuit emulator to a verification platform that includes the plurality of first instructions comprising the software model;
operably coupling interfaces of the software model of the verification platform in parallel to a second previously-validated autonomous circuit emulator and to an environment emulator;
validating the test response data output by the first autonomous circuit emulator by comparing the test response data with expected response data provided by the second autonomous circuit emulator of the verification platform; and
outputting an error notification if said validation comparison does not match for debugging functional tests for the software model,
wherein the first instructions are provided in accordance with a low-level programming language and comprise a physical description of the ASIC, and
wherein the second instructions are provided in accordance with a high-level language and comprise an abstract description of data structures of the response data based on a functional specification of the ASIC design.

2. The method according to claim 1, further comprising:
storing input stimuli sequences in one or more memory elements of the verification platform, said input stimuli sequences being associated with said software model for said ASIC in conformance with said functional specification;
inputting said input stimuli sequences to said software model to cause said software model to output stimuli sequences in response to corresponding ones of said input stimuli sequences;
providing said output stimuli sequences generated by the software model to said first autonomous circuit emulator; and
validating the software model based on outputs generated by said first autonomous circuit emulator in response to said output stimuli sequences.

3. The method according to claim 1,
wherein the stored input stimuli sequences are specified using the high-level language, and
wherein the functional specification is specified using the low-level programming language for specifying functional models of circuits.

4. The method according to claim 1, further comprising:
synchronizing execution of the first and second plurality of instructions to perform a co-simulation.

5. The method according to claim 1,
wherein the low level programming language is a Hardware Description Language (HDL) type language and the high level language is C++.

6. The method according to claim 1, further comprising:
verifying that the responses of the software model of the ASIC are within response time ranges specified in the functional specification.

7. The method according to claim 1, further comprising:
storing blocks of information used by said environment emulator according to a node address using a cache memory; and
managing one or more said node addresses using a presence vector associated with one said node so that one node address can be used for multiple nodes.

8. The method according to claim 1, further comprising:
using a set of classes to manage a collection of execution hypotheses associated with the software model; and
managing transactions that are concurrently colliding for use of the same memory block.

9. The method according to claim 8, further comprising:
generating predictions based on the node address, the presence vector, and one or more input stimuli;
eliminating predictions;
readjusting incorrect predictions;
reducing an amount of valid hypotheses; and
terminating collisions.

10. The method according to claim 9, wherein said generating predictions is performed independent from internal operation of said ASIC.

11. The method according to claim 9, wherein said generating predictions is performed using information describing internal operations of said ASIC.

12. A verification platform for on demand verification of a software model of an Application Specific Integrated Circuit (ASIC), comprising:
an integrated circuit emulator comprising
a memory for storing a functional specification of said ASIC, and error notification means; and
at least one environment emulator, each said environment emulator comprising
a stimuli generating circuit coupled to a bus,
a monitor circuit coupled to a bus, and
an adaptive circuit coupled to said stimuli generating circuit and to said monitor circuit, the adaptive circuit being configured to transform stimuli received from the stimuli generation circuit and the monitor circuit into low level programming instructions, and the adaptive circuit being coupled to the error notification means; and an adapter circuit coupled to said adaptive circuit and to said integrated circuit emulator, the adapter circuit being configured to transform low level programming instructions into high level instructions, wherein the adaptive circuit and the adapter circuit are configured to perform mutually inverse conversion functions.

13. The verification platform according to claim 12, wherein the error notification means is a comparator having a first input coupled to the adaptive circuit, a second input coupled to the integrated circuit emulator, and an output that indicates an error notification if a comparison fails between a pair of stimuli received via the first and second inputs.

14. The verification platform according to claim 12, further comprising:

a library containing a plurality of functional models of ASIC circuit blocks; and means for selecting said functional models using a definition file of the integrated circuit configuration to create a model corresponding to the functional specification of said ASIC.

15. The verification platform according to claim 12, wherein the integrated circuit emulator further comprises:

data processing means for executing operations in parallel with a simulation, wherein the data processing means is configured to interrupt execution upon detection of an error.

16. The verification platform according to claim 12, wherein the functional specification comprises:

a plurality of functional circuit elements each having at least one input and output pair and a propagation delay associated with each said input and output pair.

17. The verification platform according to claim 12, further comprising:

a cache memory for storing blocks of information used by each said at least one environment emulator according to a node address; and means for managing one or more node addresses using a presence vector associated with one said node so that one node address can be used for multiple nodes.

18. The verification platform according to claim 17, wherein the integrated circuit emulator further comprises:

a verifier core that uses a set of classes for managing a collection of execution hypotheses for a transaction in a memory block of the software model, and for managing transactions that are concurrently colliding for use of the same memory block, wherein the verifier core is configured to generate predictions based on the node address, the presence vector, and one or more input stimuli, and wherein the verifier core is further configured to eliminate predictions, readjust incorrect predictions, reduce an amount of valid hypotheses, and terminate collisions.

19. The verification platform according to claim 18, wherein the verifier core is configured to generate predictions independent from internal operation of said ASIC.

20. The verification platform according to claim 18, wherein the verifier core is configured to generate predictions using information describing internal operations of said ASIC.

21. The verification platform according to claim 12, wherein the integrated circuit emulator is configured to emulate one of a router circuit, a circuit with cache memory, and a router circuit with cache memory.

22. The verification platform according to claim 12, further comprising:

means for selecting from said library a plurality of responses, each said response being associated with a corresponding input stimulus based on a circuit to be tested; and means for storing said selected responses, wherein said plurality of selected responses constitute a test model for said ASIC.

23. A non-transitory computer-readable medium upon which is embodied a sequence of programmable instructions which, when executed by a processor, cause the processor to perform a method for on-demand functional verification of a software model of an Application Specific Integrated Circuit (ASIC) comprising:

forming, in a first mode, a first autonomous circuit emulator for the ASIC by automatically replacing a plurality of first instructions comprising a software model of the ASIC with a plurality of second instructions comprising the first autonomous circuit emulator;

receiving stimuli at the first autonomous circuit emulator;

generating, by the first autonomous circuit emulator, test response data based on the received stimuli;

outputting, in a second mode for verification, the test response data generated by the first autonomous circuit emulator to a verification platform that includes the plurality of first instructions comprising the software model;

operably coupling interfaces of the software model of the verification platform in parallel to a second previously-validated autonomous circuit emulator and to an environment emulator;

validating the test response data output by the first autonomous circuit emulator by comparing the test response data with expected response data provided by the second autonomous circuit emulator of the verification platform; and outputting an error notification if said validation comparison does not match for debugging functional tests for the software model, wherein the first instructions are provided in accordance with a low-level programming language and comprise a physical description of the ASIC, and wherein the second instructions are provided in accordance with a high-level language and comprise an abstract description of data structures of the response data based on a functional specification of the ASIC design.

24. The non-transitory computer-readable medium of claim 23, further comprising instructions for:

storing input stimuli sequences in one or more memory elements of the verification platform, said input stimuli sequences being associated with said software model for said ASIC in conformance with said functional specification;

inputting said input stimuli sequences to said software model to cause said software model to output stimuli sequences in response to corresponding ones of said input stimuli sequences;

providing said output stimuli sequences generated by the software model to said first autonomous circuit emulator; and validating the software model based on outputs generated by said first autonomous circuit emulator in response to said output stimuli sequences.

25. The non-transitory computer-readable medium of claim 23,
wherein the stored input stimuli sequences are specified using the high-level language,
wherein the functional specification is specified using the low-level programming language for specifying functional models of circuits, and
wherein the low level programming language is a Hardware Description Language (HDL) type language and the high level language is $C^{++}$.

26. The non-transitory computer-readable medium of claim 23, further comprising instructions for:
synchronizing execution of the first and second plurality of instructions to perform a co-simulation.

27. The non-transitory computer-readable medium of claim 23, further comprising instructions for:
verifying that the responses of the software model of the ASIC are within response time ranges specified in the functional specification;
storing blocks of information used by said environment emulator according to a node address using a cache memory;
managing one or more said node addresses using a presence vector associated with one said node so that one node address can be used for multiple nodes;
using a set of classes to manage a collection of execution hypotheses associated with the software model;
managing transactions that are concurrently colliding for use of the same memory block;
generating predictions based on the node address, the presence vector, and one or more input stimuli;
eliminating predictions;
readjusting incorrect predictions;
reducing an amount of valid hypotheses; and
terminating collisions.

28. The non-transitory computer-readable medium of claim 27,
wherein said generating predictions is performed independent from internal operation of said ASIC.

* * * * *

UNITED STATES PATENT AND TRADEMARK OFFICE
CERTIFICATE OF CORRECTION

| | | |
|---|---|---|
| PATENT NO. | : 7,941,771 B2 | Page 1 of 1 |
| APPLICATION NO. | : 12/133085 | |
| DATED | : May 10, 2011 | |
| INVENTOR(S) | : Anne Kaszynski | |

It is certified that error appears in the above-identified patent and that said Letters Patent is hereby corrected as shown below:

Column 19 - Line 21, delete "by a computer processing system".

Signed and Sealed this
Twenty-ninth Day of November, 2011

David J. Kappos
*Director of the United States Patent and Trademark Office*